United States Patent
Akiyama et al.

(10) Patent No.: US 9,551,745 B2
(45) Date of Patent: Jan. 24, 2017

(54) SEMICONDUCTOR DEVICE ASSESSMENT APPARATUS

(71) Applicant: MITSUBISHI ELECTRIC CORPORATION, Tokyo (JP)

(72) Inventors: Hajime Akiyama, Tokyo (JP); Akira Okada, Tokyo (JP); Kinya Yamashita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 149 days.

(21) Appl. No.: 14/188,503

(22) Filed: Feb. 24, 2014

(65) Prior Publication Data

US 2014/0347081 A1    Nov. 27, 2014

(30) Foreign Application Priority Data

May 21, 2013    (JP) .................................. 2013-107123

(51) Int. Cl.
*G01R 31/28* (2006.01)
*H01L 21/68* (2006.01)
(Continued)

(52) U.S. Cl.
CPC ......... *G01R 31/2891* (2013.01); *H01L 21/681* (2013.01); *G01B 11/14* (2013.01); *G01B 11/30* (2013.01); *G01R 31/2831* (2013.01)

(58) Field of Classification Search
CPC ............ G01R 31/2891; G01R 31/2887; G01R 31/2886; G01R 31/2893; G01R 31/2831; H01L 2924/00014; G01B 11/14; G01B 11/24; G01B 11/30
(Continued)

(56) References Cited

U.S. PATENT DOCUMENTS 6,025,730 A * 2/2000 Akram ................. G01R 1/0408
324/750.25
7,166,873 B2 * 1/2007 Okazaki .............. H01S 5/02292
257/100
(Continued)

FOREIGN PATENT DOCUMENTS

JP    S56-024943 A    3/1981
JP    S64-057633 A    3/1989
(Continued)

OTHER PUBLICATIONS

An Office Action; "Notice of Grounds of Rejection," issued by the Japanese Patent Office on Sep. 8, 2015, which corresponds to Japanese Patent Application No. 2013-107123 and is related to U.S. Appl. No. 14/188,503; with English language translation.
(Continued)

*Primary Examiner* — Melissa Koval
*Assistant Examiner* — Rahul Maini
(74) *Attorney, Agent, or Firm* — Studebaker & Brackett PC

(57) ABSTRACT

A semiconductor device assessment apparatus that electrically assesses a semiconductor device formed on a semiconductor substrate includes a holding unit having a surface to hold the semiconductor substrate thereon, and a detection unit to detect irregularity on the surface of the holding unit. The holding unit on the surface includes a plurality of grooves formed such that when the semiconductor substrate is held on the surface, the grooves overlap a periphery of the semiconductor substrate and also have a portion located outer than the periphery of the semiconductor substrate.

13 Claims, 5 Drawing Sheets

(51) Int. Cl.
*G01B 11/14* (2006.01)
*G01B 11/30* (2006.01)

(58) Field of Classification Search
USPC .................. 324/750.23; 356/600, 601, 614
See application file for complete search history.

(56) References Cited

U.S. PATENT DOCUMENTS

| | | | |
|---|---|---|---|
| 7,598,532 B2 * | 10/2009 | Fujita | H01L 33/60 257/100 |
| 7,915,746 B2 * | 3/2011 | Ohsumi | H01L 23/3114 257/790 |
| 2002/0031849 A1 * | 3/2002 | Maruyama | G01R 31/2891 438/14 |

FOREIGN PATENT DOCUMENTS

| | | | | |
|---|---|---|---|---|
| JP | H06-162987 A | | 6/1994 | |
| JP | 6-302676 A | | 10/1994 | |
| JP | 10144748 A | * | 5/1998 | ............. H01L 21/66 |
| JP | H10-144748 A | | 5/1998 | |
| JP | 2002-280287 A | | 9/2002 | |

OTHER PUBLICATIONS

An Office Action; "Grounds for Rejection," issued by the Chinese Patent Office on Jun. 30, 2016, which corresponds to Chinese Patent Application No. 201410174467.8 and is related to U.S. Appl. No. 14/188,503; with English language translation.

\* cited by examiner

SEMICONDUCTOR DEVICE ASSESSMENT APPARATUS

BACKGROUND OF THE INVENTION

Field of the Invention

The present invention relates to a semiconductor device assessment apparatus, and more specifically to a semiconductor device assessment apparatus capable of positionally detecting a semiconductor device.

Description of the Background Art

In a semiconductor device production process, semiconductor devices formed on a semiconductor substrate may have their electrical characteristics assessed before the semiconductor substrate is diced into individual semiconductor devices. In this case, the semiconductor device is assessed via an assessment apparatus generally including a stage (or a holding unit) to hold the semiconductor substrate during an assessment and a probe electrically connected to a pad of the semiconductor device formed on the semiconductor substrate. In the assessment, the semiconductor substrate is previously disposed with its center positioned at a reference position on the stage. This allows a plurality of semiconductor devices formed on the semiconductor substrate to be registered with respect to the stage all at once, and once they have been registered, the probe and the stage can be relatively moved to assess each semiconductor device individually. The semiconductor substrate may have its center position matched to the reference position on the stage by a method utilizing a peripheral edge of the semiconductor substrate.

Japanese Patent Laying-Open No. 6-302676 discloses an apparatus to inspect a wafer for foreign matters. More specifically, a wafer is placed on a table and a peripheral portion of the wafer that projects radially outer than the table is exposed to incident light, which is reflected by a mirror that is provided under the wafer adjacent to the peripheral portion's back surface to obtain an image of and near the wafer.

SUMMARY OF THE INVENTION

However, a semiconductor substrate may have a peripheral portion rounded as seen depthwise, inclined or the like, and it has thus been difficult to observe an image thereof to therefrom detect the semiconductor substrate's peripheral edge easily and precisely.

Furthermore, as the semiconductor substrate undergoes each step of a semiconductor device production method the semiconductor substrate has in-plane variation or the like in each step and thus no longer has a peripheral portion having uniform appearance or geometry, and it has thus further been difficult to observe an image thereof to therefrom detect the semiconductor substrate's peripheral edge easily and precisely. It has thus been difficult to confirm the position of the semiconductor substrate on the stage via a semiconductor device assessment apparatus with high precision.

The present invention has been made to address the above issue. A main object of the present invention lies in providing a semiconductor device assessment apparatus that can detect the position of a semiconductor substrate on a holding unit with high precision.

The present invention provides a semiconductor device assessment apparatus that electrically assesses a semiconductor device formed on a semiconductor substrate and includes a holding unit having a surface to hold the semiconductor substrate thereon and a detection unit to detect irregularity on the surface of the holding unit. The holding unit on the surface includes a plurality of grooves formed such that when the semiconductor substrate is held on the surface the grooves overlap a periphery of the semiconductor substrate and also have a portion located outer than the periphery of the semiconductor substrate.

The present invention thus contemplates a semiconductor device assessment apparatus that can detect the position of a semiconductor substrate on a holding unit with high precision.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments

Hereinafter reference will be made to the drawings to describe the present invention in embodiments. In the figures, identical or corresponding components are identically denoted and will not be described repeatedly.

First Embodiment

Figure 1:
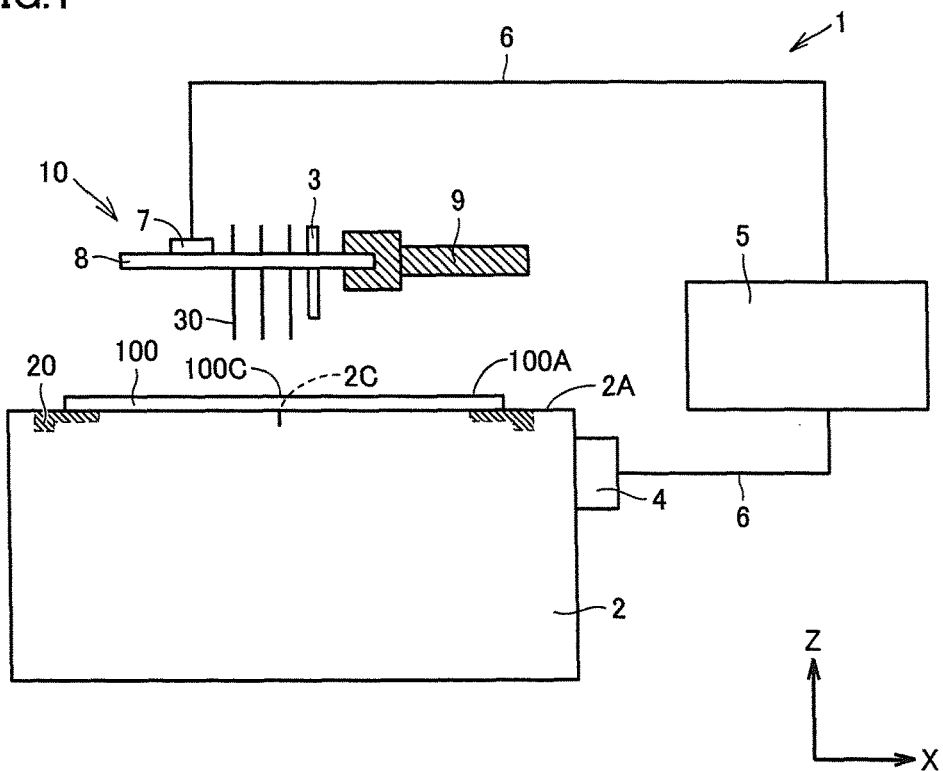
FIG. 1 is a diagram for illustrating a semiconductor device assessment apparatus according to a first embodiment.

With reference to FIG. 1, a first embodiment provides a semiconductor device assessment apparatus 1 as will be described hereinafter. Semiconductor device assessment apparatus 1 is a semiconductor device assessment apparatus that electrically assesses a semiconductor device formed on a semiconductor substrate 100. In the present embodiment, semiconductor substrate 100 has a flat surface 100A with any semiconductor device formed thereon. This semiconductor device may for example be a vertical semiconductor device that passes a large current through semiconductor substrate 100 depthwise. Semiconductor device assessment apparatus 1 according to the present embodiment includes a holding unit 2 and a detection unit 3. Note that, in the present embodiment, a surface parallel to surface 2A of holding unit 2 is represented as an xy plane.

Holding unit 2 is configured to be capable of holding semiconductor substrate 100 on surface 2A. Holding unit 2 has surface 2A provided to be larger in geometry than surface 100A of semiconductor substrate 100. That is, holding unit 2 is formed such that when semiconductor substrate 100 is held on surface 2A, holding unit 2 has a portion located outer than a periphery of semiconductor substrate 100.

Holding unit 2 at surface 2A is provided with a vacuuming suction mechanism so that when semiconductor substrate 100 is disposed on surface 2A semiconductor substrate 100 can be sucked and thus held thereon. On holding unit 2 at surface 2A a reference position 2C is defined. Reference position 2C of holding unit 2 is a position on the holding unit 2 surface 2A that semiconductor substrate 100 held on surface 2A has its center 100C in registration with.

Figure 2:
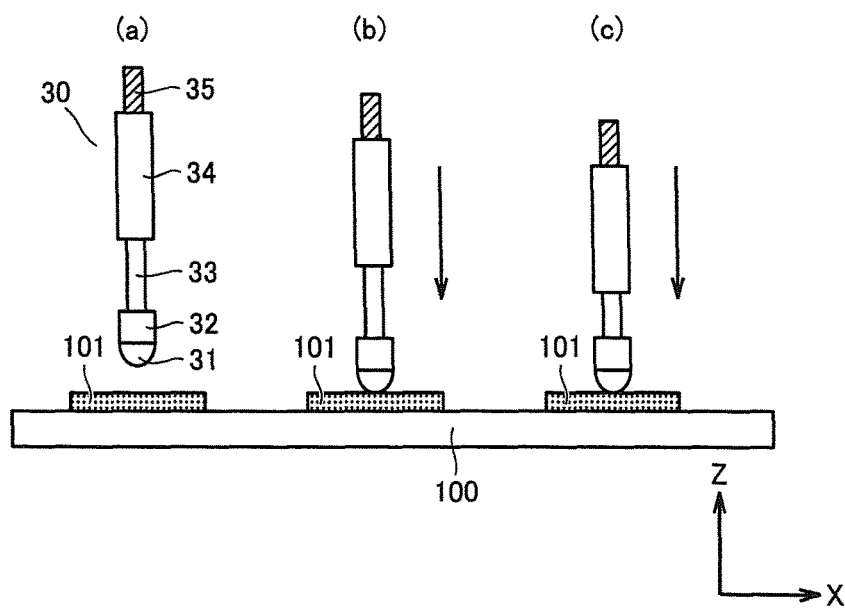
FIG. 2 is a diagram for illustrating a contact probe according to the first embodiment.

Holding unit 2 has surface 2A provided to be electrically connectable to an electrode pad 101 provided on a back surface of semiconductor substrate 100 as an electrode of a vertical semiconductor device (see FIG. 2). Surface 2A is electrically connected to a control unit 5 via a connection portion 4 provided on a side surface of holding unit 2 and a signal line 6 attached to connection portion 4.

Detection unit 3 can detect irregularity on surface 2A of holding unit 2. Detection unit 3 is an optical distance sensor, and it is provided to be capable of emitting light and also detecting a reflection of the light to measure a distance between detection unit 3 and a reflection surface (hereinafter also referred to as a level of the reflection surface). More specifically, detection unit 3 is configured such that when holding unit 2 and semiconductor substrate 100 have their respective surface 2A and surface 100A exposed to substantially perpendicular light, detection unit 3 can detect light reflected from surfaces 2A and 100A. Detection unit 3 may have any resolution equal to or smaller than the thickness of semiconductor substrate 100, and it may for example be approximately 0.5 mm.

Detection unit 3 is secured to a probe base 10. Probe base 10 is configured of detection unit 3, a contact probe 30, and an insulating substrate 8 holding detection unit 3 and contact probe 30. Probe base 10 is provided to be movable relative to holding unit 2 by a mover arm 9 connected to insulating substrate 8.

With reference to FIG. 2, contact probe 30 is electrically connectable to a semiconductor device by being brought into contact with electrode pad 101 formed on surface 100A of semiconductor substrate 100 as an electrode of the semiconductor device. If the semiconductor device has a plurality of electrode pads 101 formed thereon, a plurality of contact probes 30 may be provided to contact the plurality of electrode pads 101, respectively. Contact probe 30 is configured of a contact portion 31 that mechanically and electrically contacts electrode pad 101 of the semiconductor device formed on semiconductor substrate 100, a tip 32 having contact portion 31, a receding portion 33 allowing tip 32 to be slidable relative to the probe base, a setting portion 34 secured to the probe base, and an electrical connection portion 35 electrically connected to contact portion 31 and serving as an external output terminal. Receding portion 33 has a spring member incorporated therein and connects tip 32 and setting portion 34 via the spring member to configure tip 32 to be slidable relative to the probe base. Contact probe 30 can be formed of any electrically conducting material, such as copper (Cu), tungsten (W), rhenium tungsten or a similar metal material. Furthermore, contact portion 31 may have the metal material with a surface covered with gold (Au), palladium, tantalum (Ta), platinum (Pt), or the like for increased conductance, durability and the like. Contact probe 30 is electrically connected to a connection portion 7 via a metal plate (not shown) or the like provided on insulating substrate 8, and furthermore, it is electrically connected to control unit 5 via signal line 6 attached to connection portion 7. The probe base is provided to be movable relative to holding unit 2 by mover arm 9.

Figure 3:
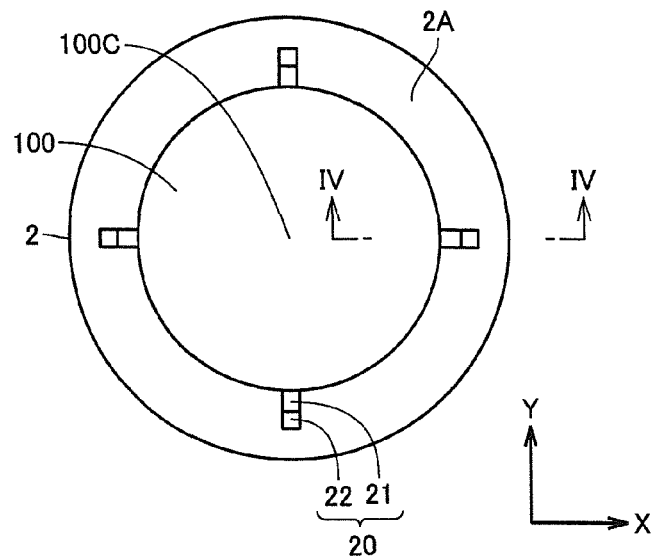
FIG. 3 is a top view of a holding unit 2 of the semiconductor device assessment apparatus according to the first embodiment.

With reference to FIG. 3, holding unit 2 is provided with four grooves 20. FIG. 3 is a top view of holding unit 2 holding semiconductor substrate 100 on surface 2A. Four grooves 20 are all formed on holding unit 2 to extend radially outward as seen at reference position 2C. In other words, four grooves 20 are each formed in a radial direction of holding unit 2. Furthermore, four grooves 20 are all equidistant from reference position 2C of holding unit 2, and any two adjacent grooves 20 form a central angle of 90 degrees with reference position 2C. In other words, two grooves are opposite to each other with reference position 2C located therebetween, and on a line segment orthogonal to that connecting these two grooves, the other two grooves 20 are opposite to each other with reference position 2C located therebetween. Furthermore, from a different viewpoint, a plurality of grooves 20 are radially uniformly spaced. Note that any two opposite grooves with reference position 2C located therebetween have their respective, radially inner ends with a distance therebetween smaller than an outer diameter of semiconductor substrate 100 and have their respective, radially outer ends with a distance therebetween larger than the outer diameter of semiconductor substrate 100. In other words, when semiconductor substrate 100 is held on the holding unit 2 surface 2A with reference position 2C and center 100C in registration, groove 20 has a portion exposed outer than the periphery of semiconductor substrate 100. Note that holding semiconductor substrate 100 on the holding unit 2 surface 2A with reference position 2C and center 100C in registration includes doing so not only with reference position 2C and center 100C in complete registration but also with reference position 2C and center 100C out of registration within a tolerable range.

Figure 4:
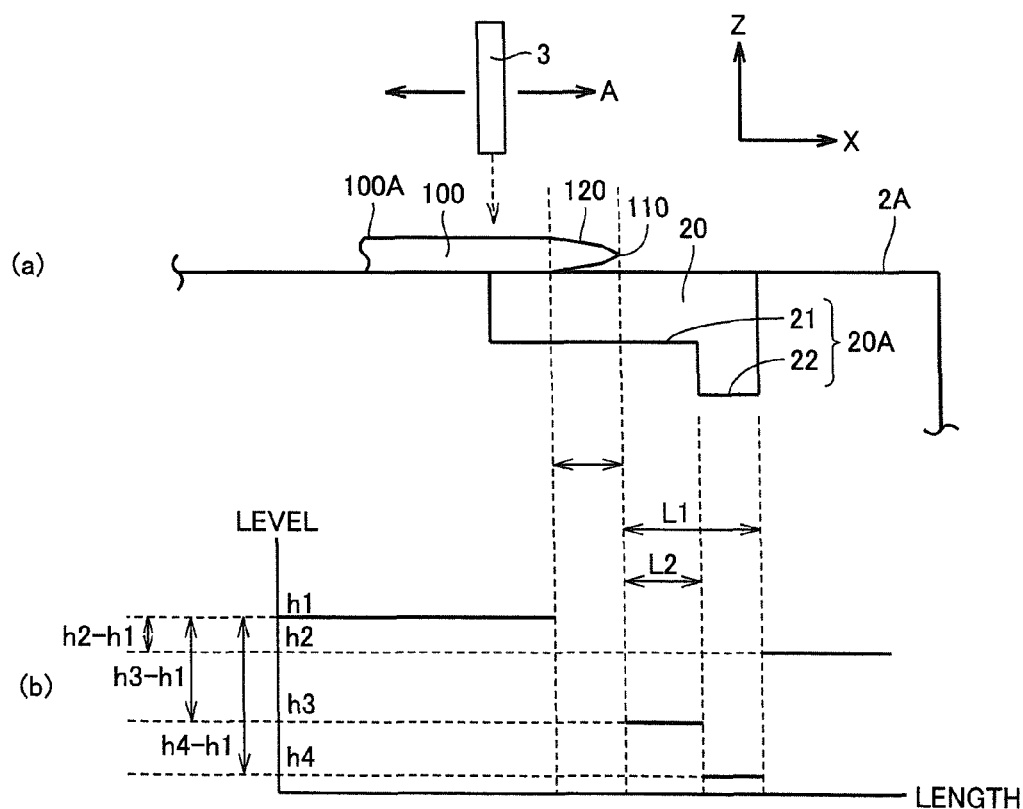
FIG. 4 is a cross section taken along a line IV-IV shown in FIG. 3, and a graph representing an exemplary measurement.

Groove 20 is formed for example by cutting or similarly working holding unit 2, and FIG. 4(a) shows a bottom surface 20A mirror finished. Bottom surface 20A is thus formed as a reflection surface of high reflectance.

Groove 20 has bottom surface 20A formed stepwise to vary in depth, as seen in a radial direction of semiconductor substrate 100 and measured from the holding unit 2 surface 2A. More specifically, groove 20 has a region relatively smaller in depth as measured from surface 2A to bottom surface 20A (i.e., an upper portion 21), and a region relatively larger in depth as measured from surface 2A to bottom surface 20A (i.e., a lower portion 22). Groove 20 has upper portion 21 closer to reference position 2C of holding unit 2 and has lower portion 22 closer to a periphery of holding unit 2. Note that upper and lower portions 21 and 22 have their respective upper surfaces parallel to surface 2A. Furthermore, four grooves 20 have their respective upper and lower portions 21 and 22 with their respective boundaries (or have their respective upper portions 21 with their respective radially outer ends) equidistant from reference position 2C.

Any two opposite grooves 20 with reference position 2C located therebetween have their respective upper and lower portions 21 and 22 with their respective boundaries having a distance therebetween larger than the outer diameter of semiconductor substrate 100. Thus this distance and the outer diameter of semiconductor substrate 100 has a difference in length therebetween, and ½ of the difference may be set as a tolerable value for misregistration of reference position 2C and center 100C. The depth of groove 20 (or those of upper and lower portions 21 and 22) and a difference between the depths respectively of upper and lower portions 21 and 22 can be selected as desired as long as they are larger than a resolution that an optical distance sensor used as detection unit 3 has, and they may be approximately 1 mm for example as an order of the same extent as the depth of upper portion 21, the difference between the depths respectively of upper and lower portions 21 and 22, the thickness of semiconductor substrate 100, and the like.

With reference to FIG. 3 and FIG. 4(a), each groove 20 is formed such that when semiconductor substrate 100 is held on the holding unit 2 surface 2A with reference position 2C and center 100C in registration, each groove 20 overlaps a periphery of semiconductor substrate 100 and also has a portion located outer than the periphery of semiconductor substrate 100. In other words, when semiconductor substrate 100 is held on the holding unit 2 surface 2A, holding unit 2 has a region that is located outer than the periphery of semiconductor substrate 100 and has some partial region exposing bottom surface 20A of groove 20 and has another region exposing surface 2A.

Reference will now be made to FIG. 1 to FIG. 4 to describe a method using the semiconductor device assessment apparatus according to the present embodiment to assess a semiconductor device. In the present embodiment, semiconductor substrate 100 has flat surface 100A, an edge 110, and a peripheral inclined surface 120 extending between flat surface 100A and edge 110 and inclined relative to surface 100A. In other words, inclined surface 120 inclines relative to the holding unit 2 surface 2A and bottom surface 20A.

Initially, semiconductor substrate 100 is disposed on the holding unit 2 surface 2A (step S10). In doing so, semiconductor substrate 100 has any semiconductor devices to be measured all positioned to be measurable by probe base 10, and semiconductor substrate 100 is thus vacuumed and thus sucked. Note that a region that is located radially inner than the periphery of semiconductor substrate 100 exposes the semiconductor substrate 100 surface 100A and inclined surface 120. In contrast, a region that is located radially outer than the periphery of semiconductor substrate 100 exposes the holding unit 2 surface 2A and four grooves 20 partially. Note that when the semiconductor devices' temperature characteristics are assessed, holding unit 2 including a heating mechanism may be used, and in that case, step S10 may be preceded by heating holding unit 2 to a prescribed temperature.

Then, detection unit 3 is moved relative to at least three grooves 20 to detect irregularity on surface 2A of holding unit 2 (step S20). Note that when surface 2A is represented as an xy plane, detection unit 3 is not moved along a z axis; rather, it is moved only within the xy plane. Thus, when detection unit 3 is located over surface 100A of semiconductor substrate 100 and thus emits light, surface 100A reflects the light, which is in turn detected by detection unit 3 to thus measure a level h1 of detection unit 3 relative to surface 100A. Furthermore, when detection unit 3 is located over the semiconductor substrate 100 peripheral inclined surface 120, which has inclination relative to a direction in which the light emitted from detection unit 3 travels, the light emitted from detection unit 3 that is reflected by inclined surface 120 does not reach detection unit 3 and the level of detection unit 3 relative to inclined surface 120 cannot be measured. Furthermore, when detection unit 3 is located over surface 2A of holding unit 2 and thus emits light, surface 2A reflects the light, which is in turn detected by detection unit 3 to thus measure a level h2 of detection unit 3 relative to surface 2A. When detection unit 3 is located over upper portion 21 of groove 20 and thus emits light, an upper surface of upper portion 21 (or an upper portion of bottom surface 20A) reflects the light, which is in turn detected by detection unit 3 to thus measure a level h3 of detection unit 3 relative to the upper surface of upper portion 21. When detection unit 3 is located over lower portion 22 of groove 20 and thus emits light, an upper surface of lower portion 22 (or a lower portion of bottom surface 20A) reflects the light, which is in turn detected by detection unit 3 to thus measure a level h4 of detection unit 3 relative to the upper surface of lower portion 22.

When detection unit 3 is moved by mover arm 9 relative to holding unit 2, detection unit 3 may be moved in any direction within the xy plane, for example in a direction from the holding unit 2 reference position 2C toward groove 20 (along an arrow A shown in FIG. 4(a)). This example provides a measurement, as represented in FIG. 4(b). When detection unit 3 is located over the semiconductor substrate 100 surface 100A, detection unit 3 detects level h1 of detection unit 3 relative to surface 100A. Subsequently, when detection unit 3 has arrived over inclined surface 120, detection unit 3 cannot capture light reflected by inclined surface 120, and thus cannot measure the level of detection unit 3 relative to inclined surface 120. Subsequently, when detection unit 3 has arrived over groove 20, then, detection unit 3 initially detects level h3 of detection unit 3 relative to bottom surface 20A of upper portion 21 and subsequently, detection unit 3 detects level h4 of detection unit 3 relative to bottom surface 20A of lower portion 22. Subsequently, when detection unit 3 has arrived over surface 2A, detection unit 3 detects level h2 of detection unit 3 relative to surface 2A. Note that the actual level of detection unit 3 relative to the semiconductor substrate 100 inclined surface 120 and edge 110, which is unmeasurable, and level h3 of detection unit 3 relative to the upper surface of upper portion 21 (i.e., the upper portion of bottom surface 20A) has a difference of approximately h3 minus h1 (at least h3 minus h2 ) and larger than the thickness of semiconductor substrate 100, i.e., h2 minus h1 . As a result, detection unit 3 can detect a length of upper portion 21 exposed outer than the periphery of semiconductor substrate 100, i.e., a length for which level h3 is detected in a radial direction of holding unit 2 (or semiconductor substrate 100), denoted in FIG. 4(b) by L2, with high precision.

In step S20, detection unit 3 is moved to straddle each groove 20 in the radial direction of holding unit 2 and thus determine a boundary of upper and lower portions 21 and 22, and length L2 of upper portion 21 exposed from the periphery of semiconductor substrate 100. It can thus be determined that semiconductor substrate 100 has a peripheral edge 110 located closer to reference position 2C than the boundary by length L2. The other grooves 20 can also similarly be measured to derive the position of semiconductor substrate 100 on the holding unit 2 surface 2A, i.e., the position of the semiconductor substrate 100 center 100C relative to the holding unit 2 reference position 2C.

Then, contact probe 30 is positioned relative to electrode pad 101 of a semiconductor device configured on semiconductor substrate 100 positionally confirmed by detection unit 3 in step S20 (step S30). More specifically, with reference to FIG. 2(a), contact probe 30 is initially disposed immediately over electrode pad 101 along the z axis. Then, with reference to FIG. 2(b), contact probe 30 is moved downward towards electrode pad 101 and thus brought into contact therewith. With reference to FIG. 2(c), contact probe 30 is further moved downward only by a prescribed distance, and receding portion 33 accordingly has its internal spring member shrunk and is thus pushed into setting portion 34. This allows contact portion 31 to contact electrode pad 101 with sufficiently large pressure exerted therebetween. Note that on probe base 10 there is a plurality of contact probes 30 formed, and for bringing the plurality of contact probes 30 into contact with a plurality of electrode pads 101, respectively, it is preferable that, before step S30, contact probes 30 should have contact portions 31 aligned for parallelism.

Then, the semiconductor devices' electrical characteristics and the like are measured (step S40). For example, a semiconductor device measured and as a result determined as being defective is rejected in a subsequent step.

The present embodiment thus provides a semiconductor device assessment apparatus including holding unit 2 having surface 2A with a plurality of grooves 20 formed thereon such that when semiconductor substrate 100 is held on surface 2A, each groove 20 overlaps a periphery of semiconductor substrate 100 and also has a portion located outer than the periphery of semiconductor substrate 100. This allows regions inner and outer than peripheral edge 110 of semiconductor substrate 100 to have distances (or levels), respectively, to the detection unit with a difference larger than the thickness of semiconductor substrate 100, i.e., h2 minus h1. Detection unit 3 can thus detect peripheral edge 110 of semiconductor substrate 100 more precisely than when holding unit 2 has surface 2A without groove 20 formed thereon. Furthermore, groove 20 having upper and lower portions 21 and 22 allows a difference in distance (or level) between upper and lower portions 21 and 22 and the detection unit to be detected. If groove 20 has a radially outer end chipped or similarly damaged or having a foreign matter adhering thereto or the like, distance L2 between the boundary of upper and lower portions 21 and 22 and the peripheral edge of the semiconductor substrate can be detected with high precision. As a result, it can be confirmed more precisely where semiconductor substrate 100 is located on holding unit 2.

Figure 5:
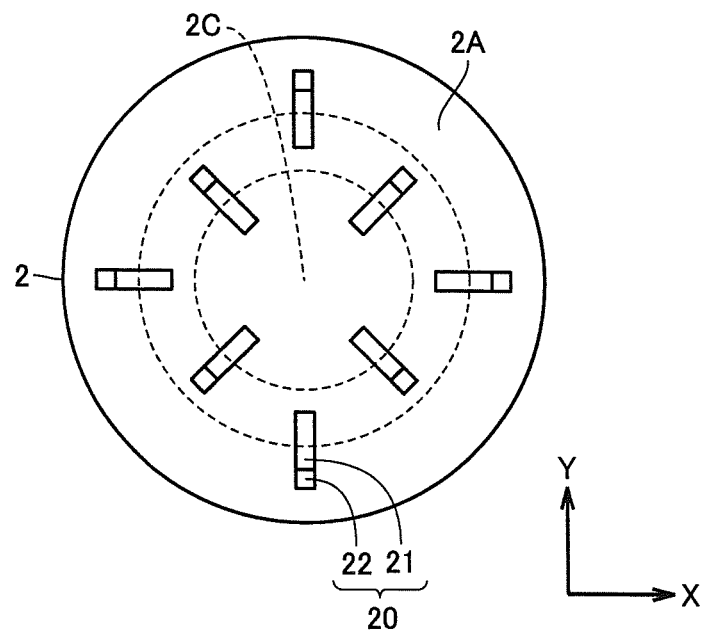
FIG. 5 is a top view of the holding unit according to the first embodiment in an exemplary variation.

While the first embodiment provides groove 20 at four locations, groove 20 is not limited as such. Furthermore, while each groove 20 is described as being equidistant from reference position 2C of holding unit 2 with any two adjacent grooves 20 forming a central angle of 90 degrees with reference position 2C, groove 20 is not limited as such. For example, with reference to FIG. 5, eight grooves 20 may be provided in two sets each formed of four grooves at four locations, respectively, with the two sets being unequidistant to reference position 2C of holding unit 2. In this example, the sets may have their grooves 20 provided such that virtual line segments virtually connecting grooves 20, respectively, of one set to reference position 2C do not overlap those virtually connecting grooves 20, respectively, of the other set to reference position 2C. This allows semiconductor substrate 100 having a different outer diameter to be also positionally confirmed on the same holding unit 2 relative thereto, and can thus eliminate the necessity of preparing an additional holding unit 2 to accommodate semiconductor substrate 100 having the different outer diameter.

Second Embodiment

Figure 6:
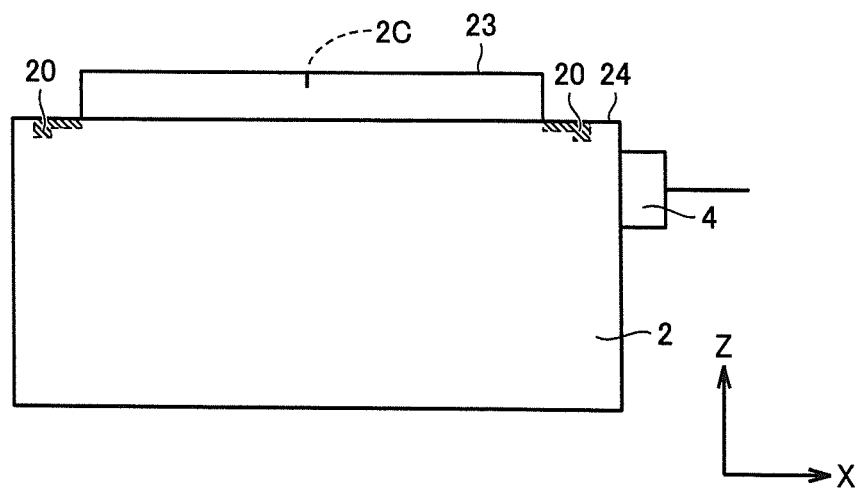
FIG. 6 is a diagram for illustrating a holding unit according to a second embodiment.
Figure 7:
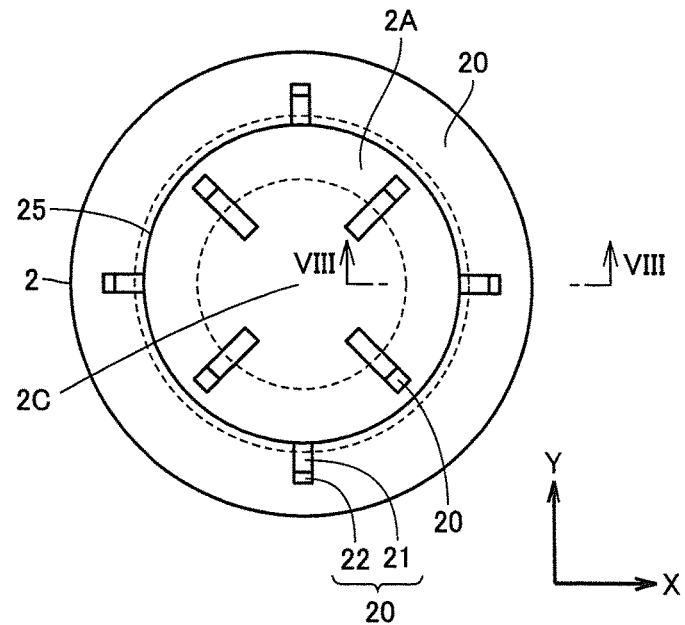
FIG. 7 is a top view of holding unit 2 of a semiconductor device assessment apparatus according to the second embodiment.
Figure 8:
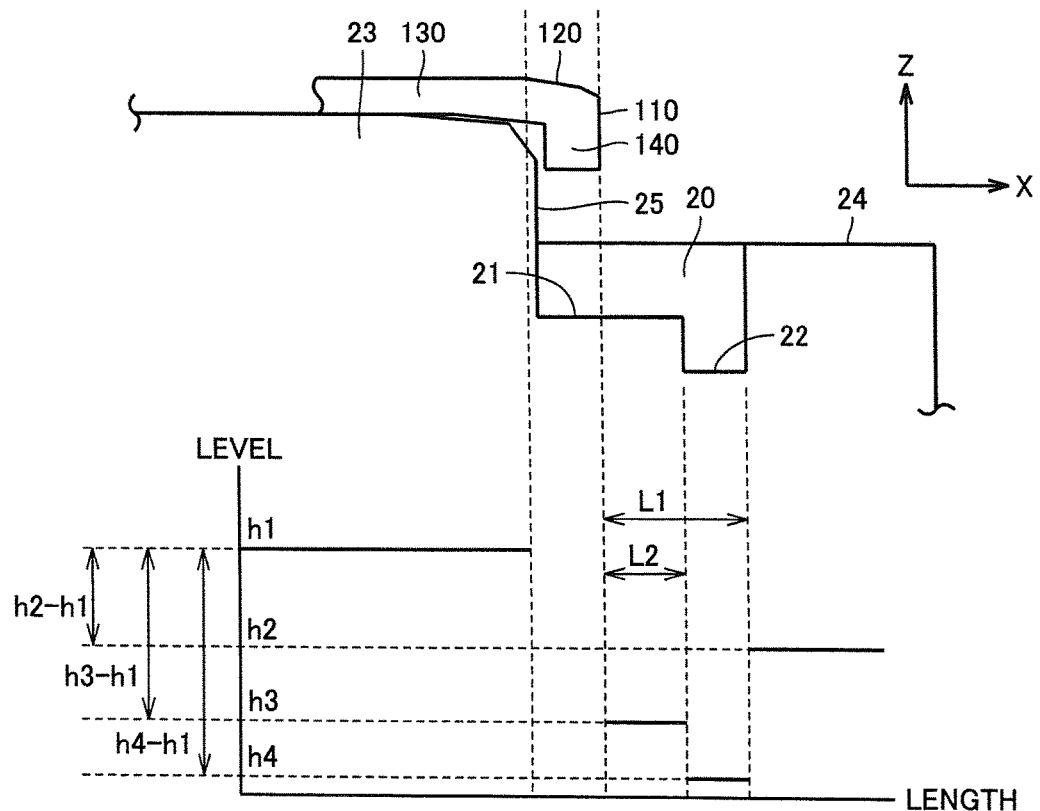
FIG. 8 is a cross section taken along a line VIII-VIII shown in FIG. 7, and a graph representing an exemplary measurement.

With reference to FIGS. 6-8, a second embodiment provides semiconductor device assessment apparatus 1, as will be described hereinafter. Semiconductor device assessment apparatus 1 according to the second embodiment is similar in configuration to that according to the first embodiment, except that the former has holding unit 2 having surface 2A with a receded portion thereon in a region adjacent to a periphery of semiconductor substrate 100 outwardly (or at a peripheral portion of surface 2A), with groove 20 formed in that receded portion.

The receded portion is provided at a position remote by a distance from reference position 2C of holding unit 2. More specifically, the receded portion is configured as follows: on surface 2A, an upper step 23 is provided in a circle with reference position 2C serving as a center thereof, and a lower step 24 is provided radially outer than upper step 23 to surround upper step 23 to serve as the receded portion.

Groove 20 overlaps a thick portion of the semiconductor substrate that defines a periphery of the semiconductor substrate, and groove 20 also has a portion outer than the periphery of the semiconductor substrate. In other words, groove 20 is provided on a surface of lower step 24. An end of groove 20 closer to reference position 2C is located at or near a boundary of upper and lower steps 23 and 24. A radially outer end of groove 20 and the boundary of upper and lower portions 21 and 22 each have a distance to reference position 2C larger than that from the semiconductor substrate's center to periphery.

If semiconductor substrate 100 has a radially inner thin portion 130 and a radially outer thicker portion 140, i.e., is a rimmed semiconductor substrate 100, upper step 23 that is equal to or smaller in diameter than thin portion 130 allows holding unit 2 to hold rimmed semiconductor substrate 100 and also allows an effect similar to that of the first embodiment.

While the first and second embodiments provide groove 20 having upper and lower portions 21 and 22 formed therein stepwise, groove 20 is not limited as such. Groove 20 may have bottom surface 20A that is a single plane without a step. This also allows regions inner and outer, respectively, than the periphery of semiconductor substrate 100 to have distances (or levels), respectively, to the detection unit with a difference larger than the thickness of semiconductor substrate 100, i.e., h2 minus h1. This can achieve an effect similar to that of the first and second embodiments when groove 20 does not have a radially outer end (i.e., an end of thereof closer to the periphery of the holding unit) chipped, flawed or similarly damaged or having a foreign matter adhering thereto or the like.

While in the first and second embodiments the position of semiconductor substrate 100 on holding unit 2 is detected using length L2 of upper portion 21 exposed from the periphery of semiconductor substrate 100, it may be detected in a different manner. For example, it may be determined that, as seen in the radial direction of holding unit 2, semiconductor substrate 100 has peripheral edge 110 located closer to reference position 2C than a boundary of the groove 20 lower portion 22 and surface 2A by a total of lengths for which levels h4 and h3, respectively, are detected, i.e., by a length L1. This can also achieve an effect similar to that of the first and second embodiments when groove 20 does not have a radially outer end (or lower portion 22 and surface 2A do not have their boundary) chipped, flawed or similarly damaged or having a foreign matter adhering thereto or the like.

Furthermore, while the first and second embodiments provide a plurality of grooves 20 having their respective upper and lower portions 21 and 22 with their respective boundaries equidistant from reference position 2C, grooves 20 are not limited as such. The boundaries may not be equidistant from reference position 2C. In that case, by previously obtaining data of a positional relationship between the boundaries and reference position 2C, where on the holding unit 2 surface 2A semiconductor substrate 100 is located can be detected with high precision from a distance between the boundary of upper and lower portions 21 and 22 of each groove 20 and an unmeasurable region.

While the first and second embodiments provide groove 20 having bottom surface 20A mirror finished, groove 20 is not limited as such. For example, bottom surface 20A may be provided with metal film to provide a reflection surface formed of metal film. Alternatively, the reflection surface may be plated with gold. This also allows bottom surface 20A to be enhanced in optical reflectance and can thus achieve an effect similar to that of the first and second embodiments.

While the first and second embodiments provide probe base 10 to be movable relative to holding unit 2, they may be provided in a different manner. For example, holding unit 2 may be movable relative to the probe base. This is also as effective as the present embodiment.

While the first and second embodiments provide detection unit 3 on probe base 10, detection unit 3 is not limited as such. Detection unit 3 may be discrete from probe base 10.

Furthermore, while the first and second embodiments provide contact probe 30 configured to include a spring and thus be slidable along the z axis, contact probe 30 is not limited as such. For example, contact probe 30 may be a stacked probe, a wire probe, or the like. Furthermore, contact probe 30 may be cantilevered.

Furthermore, while the first and second embodiments provide holding unit 2 having surface 2A that is a flat surface, holding unit 2 is not limited as such. For example, holding unit 2 may have surface 2A satin finished. Holding unit 2 can thus have surface 2A less sticky to semiconductor substrate 100. While in this example it is difficult to allow surface 2A to serve as a reflection surface, the step in groove 20 between upper and lower portions 21 and 22 can still be detected, and a distance from the boundary of upper and lower portions 21 and 22 (or the radially outer end of upper portion 21) to reference position 2C and a resultant detection obtained in each groove 20 via detection unit 3 can be used to detect where on the holding unit 2 surface 2A semiconductor substrate 100 is located with high precision.

Figure 9:
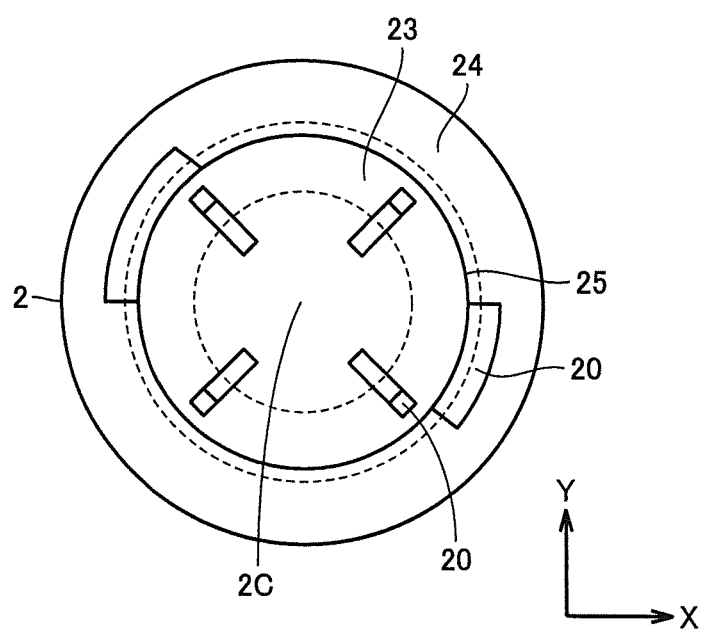
FIG. 9 is a top view of the holding unit according to the second embodiment in an exemplary variation.

Furthermore, while the first and second embodiments provide a plurality of grooves 20 in the radial direction of holding unit 2, grooves 20 are not limited as such. For example, with reference to FIG. 9, groove 20 may be formed along a circumference of semiconductor substrate 100. The semiconductor device assessment apparatus according to the second embodiment may have groove 20 formed along a side surface 25 of upper step 23. This can also achieve an effect similar to that of the first and second embodiments.

Furthermore, in the first and second embodiments, the plurality of grooves 20 may be covered with a protective film. In that case, the protective film is only required to be capable of transmitting the light used by detection unit 3. For example, the protective film may be formed of a material having a transmittance of 60% or larger, and it may for example be zinc oxide.

The present invention's characteristic configurations will now be enumerated, although there is a portion partially overlapping the embodiments described above.

The present invention provides a semiconductor device assessment method that is a semiconductor device assessment apparatus that electrically assesses a semiconductor device formed on semiconductor substrate 100 and includes holding unit 2 having surface 2A to hold semiconductor substrate 100 thereon, and detection unit 3 to detect irregularity on surface 2A of holding unit 2. Holding unit 2 on surface 2A includes a plurality of grooves 20 formed such that when semiconductor substrate 100 is held on surface 2A, grooves 20 overlap a periphery of semiconductor substrate 100 and also have a portion located outer than the periphery of semiconductor substrate 100.

This allows regions inner and outer than peripheral edge 110 of semiconductor substrate 100 to have distances (or levels), respectively, to detection unit 3 with a difference larger than when there is no groove 20. Detection unit 3 can thus detect peripheral edge 110 of semiconductor substrate 100 more precisely than when holding unit 2 has surface 2A without groove 20 formed thereon. As a result, probe base 10 can be registered with semiconductor substrate 100 more precisely.

Groove 20 may be formed such that when semiconductor substrate 100 is held on surface 2A, groove 20 extends from a side closer to a center of semiconductor substrate 100 toward that closer to the periphery of semiconductor substrate 100.

If it is tolerable that semiconductor substrate 100 has its center misregistered with a reference position of holding unit 2, then despite such misregistration, detection unit 3 can detect peripheral edge 110 of semiconductor substrate 100 with high precision, and probe base 10 can be registered with semiconductor substrate 100 more precisely.

Groove 20 may be formed such that when semiconductor substrate 100 is held on surface 2A, groove 20 extends along a circumference of semiconductor substrate 100.

This allows detection unit 3 to detect peripheral edge 110 of semiconductor substrate 100 with high precision in any region on the periphery of semiconductor substrate 100.

Groove 20 may be formed such that when semiconductor substrate 100 is held on surface 2A, more than one groove is located each at a different position as seen in a radial direction of semiconductor substrate 100.

If semiconductor substrate 100 having a different outer diameter is held on surface 2A, groove 20 that overlaps the periphery of semiconductor substrate 100 and also has a portion located outer than the periphery of semiconductor substrate 100, can also be used to detect the semiconductor substrate 100 peripheral edge 110 with high precision.

Surface 2A and bottom surface 20A of groove 20 may be in parallel.

This allows detection unit 3 to form substantially equal angles with surface 2A and bottom surface 20A, respectively. For example, if detection unit 3 is an optical distance sensor, surface 2A and bottom surface 20A can be substantially equally angled relative to the optical axis of the light emitted by detection unit 3. As a result, detection unit 3 can be configured to efficiently receive light emitted therefrom and reflected by surface 2A or bottom surface 20A. Furthermore, bottom surface 20A is fixed in depth as measured from surface 2A, and groove 20 can be easily formed in an existing holding unit 2.

Bottom surface 20A may vary in depth as measured from surface 2A in a region outer than the periphery of semiconductor substrate 100, with semiconductor substrate 100 held on surface 2A, between a subregion closer to the center of semiconductor substrate 100 and that farther away from the center of semiconductor substrate 100.

If groove 20 has a radially outer end (i.e., an end thereof closer to the periphery of holding unit 2) chipped, flawed or similarly damaged or having a foreign matter adhering thereto or the like, peripheral edge 110 can positionally be detected with high precision. More specifically, when semiconductor substrate 100 is held on surface 2A, groove 20 in a region thereof outer than the periphery of semiconductor substrate 100 has a step different from the radially outer end. In other words, groove 20 has upper and lower portions 21 and 22. If groove 20 has a radially outer end chipped or similarly damaged or having a foreign matter adhering thereto or the like, the step that is provided inner than that end and also exposed outer than the periphery of semiconductor substrate 100 can be detected as a difference between a distance (or level) between upper portion 21 and detection unit 3 and that between lower portion 22 and detection unit 3 to detect a distance between the step and peripheral edge 110 of semiconductor substrate 100 with high precision.

Detection unit 3 is an optical distance sensor, and groove 20 may have a reflection surface on bottom surface 20A.

Groove 20 having bottom surface 20A that is a reflection surface can reflect a majority of light emitted by detection unit 3 thereto. As a result, bottom surface 20A, or the reflection surface, can reflect an increased amount of light to reach detection unit 3 and thus allows the semiconductor substrate 100 peripheral edge 110 to be detected more precisely.

The reflection surface may be mirror finished. This allows holding unit 2 to be provided with groove 20, followed by mirror-finishing bottom surface 20A of groove 20 and thus providing a reflection surface. The reflection surface can thus be provided at a low cost.

The reflection surface may be formed of metal film. Groove 20 having bottom surface 20A that is a reflection surface of metal film can also reflect a majority of light emitted by detection unit 3 thereto. As a result, bottom surface 20A, or the reflection surface, can reflect an increased amount of light to reach detection unit 3 and thus allows the semiconductor substrate 100 peripheral edge 110 to be detected more precisely.

The reflection surface may be plated with gold. Groove 20 having bottom surface 20A that is a reflection surface plated with gold can also reflect a majority of light emitted by detection unit 3 thereto. As a result, bottom surface 20A, or the reflection surface, can reflect an increased amount of light to reach detection unit 3 and thus allows the semiconductor substrate 100 peripheral edge 110 to be detected more precisely.

Holding unit 2 may have surface 2A satin finished. Holding unit 2 can thus have surface 2A less sticky to semiconductor substrate 100 held on surface 2A.

The semiconductor device assessment apparatus may further include a measurement unit (or contact probe 30) electrically connected to a pad portion (e.g., electrode pad 101 shown in FIG. 2) of the semiconductor device, and a measurement unit base (or probe base 10) holding the measurement unit (or contact probe 30), and detection unit 3 may be provided at the measurement unit base (or probe base 10).

This can miniaturize semiconductor device assessment apparatus 1. Groove 20 may be covered with a protective film. This can prevent groove 20 from: internally having a foreign matter adhering thereto; being smeared and/or the like; having a radially outer end chipped or similarly damaged; and the like.

Holding unit 2 may have surface 2A with a receded portion thereon adjacent to the periphery of semiconductor substrate 100 outwardly and groove 20 may be formed in the receded portion.

In other words, holding unit 2 may have surface 2A with upper step 23 closer to the center of the semiconductor substrate and lower step 24 outer than and surrounding upper step 23. Peripheral edge 110 of semiconductor substrate 100 having radially inner thin portion 130 and radially outer, surrounding thicker portion 140 can also be detected with high precision.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device assessment apparatus that electrically assesses a semiconductor device formed on a semiconductor substrate, comprising:
   a holding unit having a surface to hold a semiconductor substrate thereon; and
   a detection unit to detect irregularity on said surface of said holding unit, wherein said irregularity includes a variation in a distance between said detection unit and said surface of said holding unit,
   said holding unit on said surface including a plurality of grooves formed such that when said semiconductor substrate is held on said surface said grooves overlap a periphery of said semiconductor substrate and also have a portion located outer than the periphery of said semiconductor substrate,
   said grooves, in a region outer to the periphery of said semiconductor substrate, have a step different from a radially outer end of said grooves,
   a bottom surface of said grooves varies in depth, as measured from said surface of said holding unit, in the region outer to the periphery of said semiconductor substrate, with said semiconductor substrate held on said surface of said holding unit, between a subregion closer to a center of said semiconductor substrate and that farther away from the center of said semiconductor substrate, and
   said detection unit is configured to detect a distance between the periphery of said semiconductor substrate and a boundary between said subregion closer to the center of said semiconductor substrate and that farther away from the center of said semiconductor substrate.

2. The semiconductor device assessment apparatus according to claim 1, wherein said groove is formed such that when said semiconductor substrate is held on said surface, said groove extends from a side closer to a center of said semiconductor substrate toward that closer to the periphery of said semiconductor substrate.

3. The semiconductor device assessment apparatus according to claim 1, wherein said groove is formed such that when said semiconductor substrate is held on said surface, said groove extends along a circumference of said semiconductor substrate.

4. The semiconductor device assessment apparatus according to claim 1, wherein said groove is formed such that when said semiconductor substrate is held on said surface, more than one said groove is located each at a different position as seen in a radial direction of said semiconductor substrate.

5. The semiconductor device assessment apparatus according to claim 1, wherein said surface and a bottom surface of said groove are in parallel.

6. The semiconductor device assessment apparatus according to claim 5, wherein said detection unit is an optical distance sensor and said groove has a reflection surface on said bottom surface.

7. The semiconductor device assessment apparatus according to claim 6, wherein said reflection surface is mirror-finished.

8. The semiconductor device assessment apparatus according to claim 6, wherein said reflection surface is formed of metal film.

9. The semiconductor device assessment apparatus according to claim 8, wherein said reflection surface is plated with gold.

10. The semiconductor device assessment apparatus according to claim 1, wherein said surface of said holding unit is satin-finished.

11. The semiconductor device assessment apparatus according to claim 1, further comprising a measurement unit electrically connected to a pad portion of said semiconductor device, and a measurement unit base holding said measurement unit, wherein said detection unit is provided at said measurement unit base.

12. The semiconductor device assessment apparatus according to claim 1, wherein said groove is covered with a protective film.

13. The semiconductor device assessment apparatus according to claim 1, wherein said surface of said holding unit has a receded portion adjacent to the periphery of said semiconductor substrate outwardly and said groove is formed in said receded portion.

* * * * *